US007869385B2

(12) United States Patent
Leonard et al.

(10) Patent No.: US 7,869,385 B2
(45) Date of Patent: Jan. 11, 2011

(54) INTERACTIVITY WITH A BUS INTERFACE CARD

(75) Inventors: James V. Leonard, St. Charles, MO (US); Robert K. Menzel, Lake St. Louis, MO (US); Richard E. Meyer, Florissant, MO (US); Aaron L. Eggemeyer, Chester, IL (US); William J. Ebert, Kirkwood, MO (US)

(73) Assignee: The Boeing Company, Chicago, IL (US)

( * ) Notice: Subject to any disclaimer, the term of this patent is extended or adjusted under 35 U.S.C. 154(b) by 346 days.

(21) Appl. No.: 11/931,486

(22) Filed: Oct. 31, 2007

(65) Prior Publication Data

US 2009/0109863 A1 Apr. 30, 2009

(51) Int. Cl.

| | |
|---|---|
| ***H04L 12/28*** | (2006.01) |
| ***H04L 12/40*** | (2006.01) |
| ***G01C 23/00*** | (2006.01) |
| ***B60G 23/00*** | (2006.01) |
| ***B60G 17/018*** | (2006.01) |

(52) U.S. Cl. ....................... 370/257; 370/423; 370/438; 701/3; 701/14; 701/29

(58) Field of Classification Search ................. 370/463; 701/1-8

See application file for complete search history.

(56) References Cited

U.S. PATENT DOCUMENTS

| | | | | |
|---|---|---|---|---|
| 4,734,909 | A * | 3/1988 | Bennett et al. | 370/462 |
| 5,377,109 | A | 12/1994 | Baker et al. | |
| 5,541,839 | A * | 7/1996 | Mitzkus et al. | 244/3.16 |
| 5,548,510 | A | 8/1996 | Ebert et al. | |
| 5,992,290 | A | 11/1999 | Quebedeauz et al. | |
| 6,122,569 | A | 9/2000 | Ebert et al. | |
| 6,615,115 | B1 | 9/2003 | Ebert et al. | |
| 6,615,116 | B2 | 9/2003 | Ebert et al. | |
| 7,137,599 | B1 | 11/2006 | Sitzmann et al. | |
| 7,353,090 | B2 | 4/2008 | Leonard et al. | |
| 2003/0033059 | A1 * | 2/2003 | Ebert et al. | 701/3 |
| 2004/0015273 | A1 | 1/2004 | Leonard et al. | |
| 2008/0249678 | A1 * | 10/2008 | Bailly et al. | 701/29 |

* cited by examiner

*Primary Examiner*—Huy D Vu
*Assistant Examiner*—Brandon Renner
(74) *Attorney, Agent, or Firm*—Alston & Bird LLP

(57) ABSTRACT

A system and method are provided for testing the bus interface assembly in order to determine if the bus interface assembly is configured to interface with a data bus between an aircraft and a store. If the bus interface assembly is determined not to be properly configured, a troubleshooting routine can be deployed to more specifically identify a malfunction of the bus interface assembly, thereby facilitating the repair of the bus interface assembly. Moreover, the system and method may also program the bus interface assembly. By providing the capability to test and troubleshoot and, in some instances, program the bus interface assembly, the bus interface assembly may be more readily deployed and the performance of the bus interface assembly may be assured, thereby promoting the reliability of the bus interface assembly and the associated communications transferred across the data bus between the aircraft and the store.

22 Claims, 10 Drawing Sheets

INTERACTIVITY WITH A BUS INTERFACE CARD

FIELD OF THE INVENTION

Embodiments of the present invention relate generally to interacting with a bus interface card and, more particularly, to programming, testing or troubleshooting a bus interface card.

BACKGROUND OF THE INVENTION

Modern aircraft, such as the F-15 aircraft manufactured by the assignee of the present invention, and the P-3, the S-3 and the F-16 aircraft manufactured by Lockheed Aeronautical Systems Company, are adapted to carry stores. These stores can, for example, include missiles, such as the Standoff Land Attack Missile (SLAM), the Harpoon Block I missile, and the Harpoon Block II missile. A missile is generally mounted to the wing of a host aircraft, typically via disconnectable pylons, such that the aircraft can carry the missile to the vicinity of the target destination prior to its deployment.

Typically, aircraft include provisions to carry and launch stores of a predetermined type. For example, aircraft such as the P-3 aircraft typically have provisions to carry and launch Harpoon Block I missiles. The aircraft provisions can include aircraft wiring and a weapon control subsystem, such as a Harpoon Aircraft Command and Launch Control System (HACLCS). In this regard, the weapon control subsystem can provide pre-launch power and control signals to develop and load mission and target parameters into the store, and then provide launch functions to the store and thereafter release the store. Generally, the store is attached to the aircraft at a weapon store pylon that provides the mechanical mounting and release mechanisms and the electrical connection for the power, control and communication link with the weapon control subsystem within the aircraft. In turn, a short umbilical cable normally provides the electrical connection between the store and the aircraft. In this regard, the umbilical cable is typically mechanically restrained and electrically connected to the aircraft pylon on one end, and electrically connected through a releasable connector at a store umbilical connector at the other end.

In some instances, it is desirable to monitor the communications between the weapon control subsystem and the store. For example, U.S. patent application Ser. No. 10/957,824 (the '824 application), filed Oct. 4, 2004 and entitled "System, Bus Monitor Assembly and Method of Monitoring at Least One Data Bus of an Aircraft", describes an aircraft that may be adapted to control the operation of a store of one predetermined type, such as a Harpoon Block I missile, but that is also capable of carrying a store of a different predetermined type, such as a Harpoon Block II missile. Regardless of the type of store that is carried by the aircraft, the aircraft is capable of communicating with the store across a communications bus, such as a MK-82 Digital Data bus. In instances in which one predetermined type of store utilizes an expanded data set, such as to permit more sophisticated flight control and navigation, relative to the other predetermined type of store, the bus monitor assembly is capable of capturing traffic on the communications bus (i.e., data communications between the aircraft and the store) and determining if the bus communications are correct for type of store carried by the aircraft. In addition to capturing traffic on the communications bus and determining if the communications are correct, the bus monitor assembly of the '824 application may also be capable of providing menu-driven displays to facilitate a user directing the bus monitor assembly to display the captured communications.

In order to interface with the communications bus, a bus interface card assembly, such as an MK-82 interface (I/F) card assembly, may be employed. A bus monitor assembly, such as described by the '824 application, can also include a bus interface card to monitor the communications bus of the aircraft. While a bus interface card assembly is oftentimes necessary to interface with the communications bus, difficulties may arise in instances in which a bus interface card is improperly programmed or otherwise has an error. For example, a bus interface card that is improperly programmed or that has a malfunctioning component may not permit signals to be transmitted and/or received via the communications bus in the manner that is desired.

Although the bus monitor assembly is useful for determining if the communications between the aircraft and the store are correct, there remains a need in the art to more fully interact with various bus interface assemblies, such as MK 82 I/F assemblies. This need for more interaction with a bus interface assembly exists not only in conjunction with an aircraft weapon control system, but also in other applications including, for example, in conjunction with software development and the development and testing of aircraft and weapon test equipment.

SUMMARY

A system and method are provided for testing the bus interface assembly in order to determine if the bus interface assembly is configured to correctly interface with a data bus between an aircraft and a store. If the bus interface assembly is determined not to be properly configured, a troubleshooting routine can be deployed to more specifically identify a malfunction of the bus interface assembly, thereby facilitating the repair of the bus interface assembly. Moreover, the system and method of one embodiment may also program the bus interface assembly. By providing the capability to test and troubleshoot and, in some instances, program the bus interface assembly, the bus interface assembly may be more readily deployed and the performance of the bus interface assembly may be assured, thereby promoting the reliability of the bus interface assembly and the associated communications transferred across the data bus between the aircraft and the store.

In accordance with one aspect of the present invention, a system is provided that is configured to interface with the data bus of an aircraft via which the operation of a store is controlled. The system includes a bus interface assembly configured to interface with the data bus between the aircraft and the store. The system also includes a bus interface test assembly configured to determine if the bus interface assembly is configured to correctly interface with the data bus. The bus interface test assembly is further configured to perform a troubleshooting routine if the bus interface assembly is not configured to correctly interface with the data bus in order to identify the malfunction of the bus interface assembly. In this regard, the bus interface test assembly may be configured to perform a troubleshooting routine to identify one or more elements of the bus interface assembly that are candidates to have malfunctioned. In addition to testing and troubleshooting the bus interface assembly, the bus interface test assembly may also be configured to program the bus interface assembly. In one embodiment, the bus interface test assembly is embodied by a computing device that includes a processor that is on communication with the data bus and the bus interface assembly so as to test, troubleshoot and, in some embodiments, program the bus interface assembly.

The bus interface test assembly may interact with the bus interface assembly in various manners. In one embodiment, the bus interface test assembly is configured to initiate communications with the bus interface assembly. The bus interface test assembly is also configured to then cause the bus interface assembly to perform each of a plurality of predefined functions in order to determine that the bus interface assembly is configured to correctly interface with the data bus.

In accordance with one embodiment, the system includes a bus monitor assembly which includes the bus interface assembly and which is configured to capture data communications transferred across the data bus between the aircraft and the store. The bus monitor assembly is also configured to prepare the data communications and monitor the data bus across which the data communications are transferred. In this regard, the communication bus is monitored based upon the prepared data communications.

In one embodiment, the bus monitor assembly includes a computer system configured to capture the data communications, prepare the data communications and monitor the data bus across which the data communications are transferred. The computer system is also configured to provide at least one external output in response to capture of the data communications. The bus monitor assembly of this embodiment also includes an event detector configured to capture at least one external output of each of the aircraft and the computer system. The event detector is also configured to determine or facilitate the determination of a time latency between capture of at least one external output of the aircraft and at least one external output of the computer system.

In accordance with another aspect of the present invention, a method is provided for interfacing with the data bus of an aircraft via which operation of a store is controlled. The method includes the provision of a bus interface assembly for interfacing with the data bus between the aircraft and the store. The method also includes the determination of whether the bus interface assembly is configured to correctly interface with the data bus and the performance of a troubleshooting routine if the bus interface assembly is determined to not be configured to correctly interface with the data bus, thereby permitting a malfunction of the bus interface assembly to be identified. In performing the troubleshooting routine, one or more elements of the bus interface assembly may be identified to be candidates to have malfunctioned. In addition to testing and troubleshooting the bus interface assembly, the method of one embodiment may also program the bus interface assembly prior to determining if the bus monitor assembly is configured to correctly interface with the data bus.

In one embodiment, communications are initiated with the bus interface assembly prior to determining if the bus interface assembly is configured to correctly interface with the data bus. Once communications have been initiated with the bus interface assembly, the bus interface assembly may be caused to perform each of a plurality of predefined functions in order to determine if the bus interface assembly is correctly configured.

In one embodiment, data communications transferred across the data bus between the aircraft and the store may be captured. Data communications may then be prepared and the communications bus may then be monitored based upon the prepared communications. In capturing the data communications, data communications may be captured at the bus interface assembly. Additionally, at least one external output of each of the aircraft and the bus monitor assembly may be captured. In this regard, the at least one external output of a bus interface assembly may be provided in response to the bus interface assembly capturing data communications. Thereafter, a time latency between capturing of the external output of the aircraft and the external output of the bus interface assembly may be determined.

By appropriately testing the bus interface assembly, the system and method of embodiments of the present invention permit malfunctions of the bus interface assembly to be identified. Thereafter, the system and method of embodiments of the present invention can troubleshoot the bus interface assembly in order to facilitate repair of the bus interface assembly and, in turn, to improve upon the reliability of the bus interface assembly. Further, the programming of the bus interface assembly provided by the system and method of some embodiments of the present invention facilitate installation and the configuration of the bus interface assembly.

BRIEF DESCRIPTION OF THE DRAWINGS

The above and other objects, features, and advantages of the invention will become more apparent from the following description of certain preferred embodiments thereof, when taken in conjunction with the accompanying drawings in which.

As used herein, the term exemplary indicates an example and not necessarily an ideal.

DETAILED DESCRIPTION OF THE DRAWINGS

Embodiments of the present invention now will be described more fully hereinafter with reference to the accompanying drawings. This invention may, however, be practiced in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

As described below, a bus interface test assembly is provided for interacting with a bus interface assembly, such as an MK 82 I/F assembly, such as to program, test and/or troubleshoot the bus interface assembly. While the bus interface test assembly can be employed in a variety of applications and on various platforms as described below, one example of a bus interface test assembly for testing a bus interface assembly is described below in the context of the programming, testing and/or troubleshooting of an MK 82 I/F assembly that is deployed onboard an aircraft for interfacing with an MK 82 communications bus. As should be apparent, this example of a bus interface test assembly is provided by way of example and not of limitation.

Figure 1:
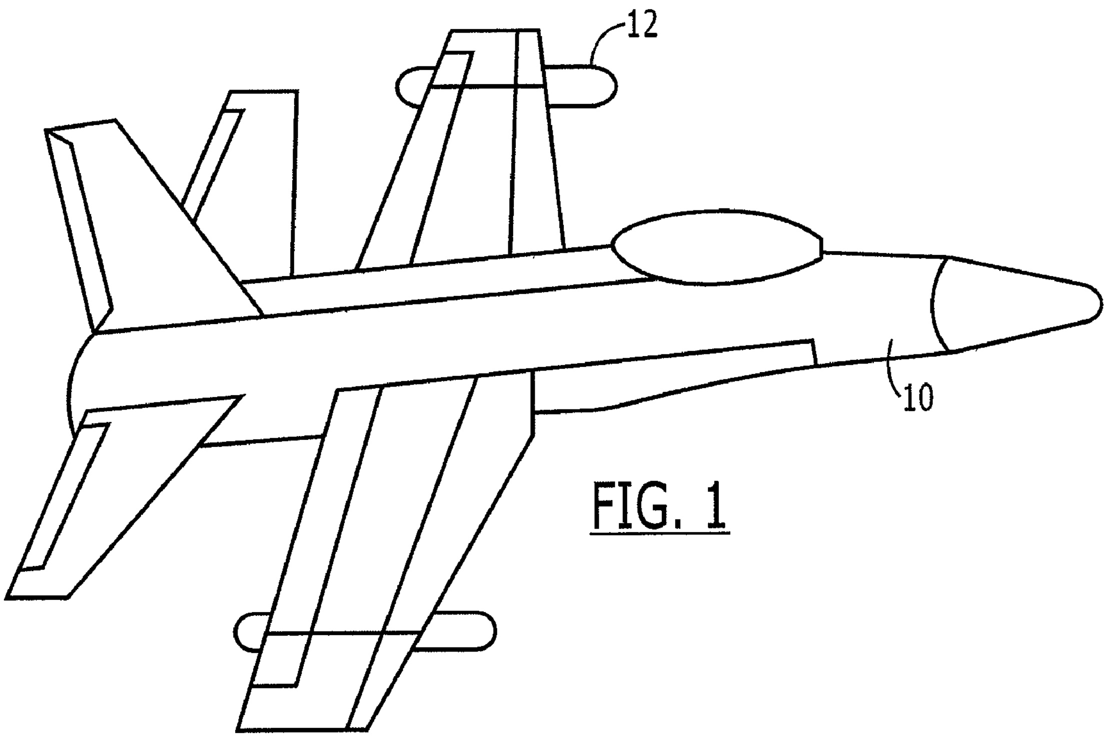
FIG. 1 is a perspective view showing an aircraft carrying a missile store.

Referring now to FIG. 1, an aircraft 10 and one type of associated store is illustrated. As used herein, a store is an object, such as a missile, intended for carriage and mounted on an aircraft, and each type of store refers to a particular kink, class or group of stores. The aircraft can comprise any number of aircraft adapted to control the operation, i.e., the manner of functioning, of stores of a second predetermined type, such as Harpoon Block I or SLAM missiles. For example, the aircraft can comprise a P-3 maritime patrol aircraft manufactured by Lockheed Aeronautical Systems Company.

A missile 12 represents one type of associated store that may be carried on the aircraft. The aircraft can carry missiles of both first and second predetermined types, although the aircraft is generally adapted to control the operation of stores of the second predetermined type, such as Harpoon Block I missiles or SLAM missiles. A missile of a first predetermined type can comprise a Harpoon Block II missile, as such is known. The aircraft 10 and missile are generally adapted to process signals in accordance with a communications format, such as the signal format known as Harpoon MK-82 Digital Data Bus. As is known to those skilled in the art, the MK-82 Digital Data Bus provides four signals, including three input signals consisting of a clock strobe, a missile data out signal consisting of 16 bits plus a parity bit, a data enable signal, and one output signal (a data in signal). As used herein, stores of the second predetermined type may be described as Harpoon Block I missiles, and stores of the first predetermined type may be described as Harpoon Block II missiles. It will be understood, however, that the type of stores can vary without departing from the spirit and scope of the present invention. For example, stores of the second predetermined type can comprise SLAM missiles.

Figure 2A:
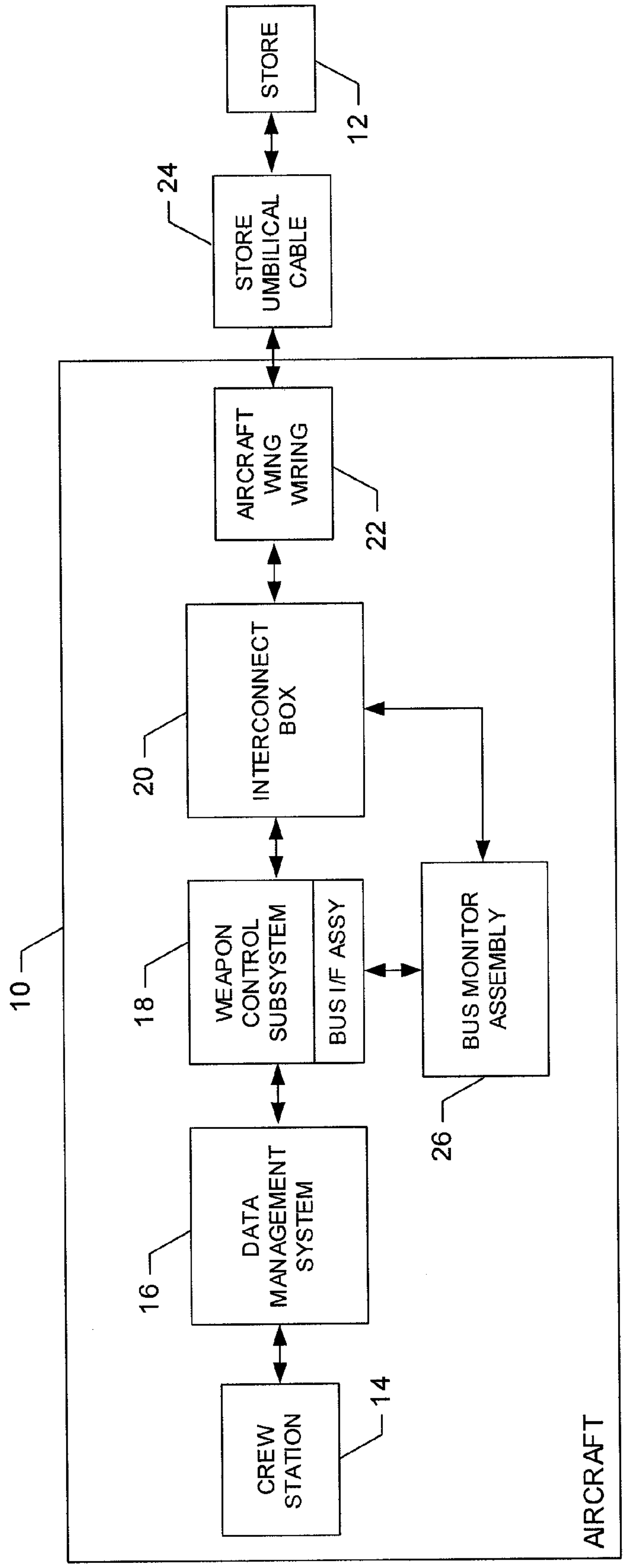
FIG. 2A is a block diagram illustrating a system for monitoring at least one data bus of an aircraft according to one embodiment of the present invention.

As illustrated in FIG. 2A, the aircraft 10 includes a crew station 14 that generally contains a plurality of controls and display devices, such as head-down and head-up video displays, a control stick, and a throttle, which are used by an aircrew to fly the aircraft and to interact with, and deploy, the associated stores. In this regard, the crewstation controls and display devices communicate with a data management system 16, which controls the overall operation of many of the aircraft subsystems, such as during the launch sequence of the store 12. The data management system communicates with other avionics equipment, such as a weapon control subsystem 18. The weapon control subsystem comprises, for example, a Harpoon Aircraft Command and Launch Control System (HACLCS), which is typically used in conjunction with the deployment of Harpoon Block I missiles. The weapon control subsystem provides the missiles with power, typically three-phase AC power and 28 V DC power. In this regard, missiles such as Harpoon Block I missiles typically include a power converter for receiving the three-phase power from the weapon control subsystem. Also, the weapon control subsystem typically provides commands to control and propulsion systems of the missiles to trigger deployment of the missile, and the weapon control subsystem typically receives status from sensors and the control systems to thereby indicate a status of the missiles.

The weapon control subsystem 18 includes a control panel that allows an operator to choose a mode of operation of the aircraft 10 in controlling the operation of the store 12. Also, the control panel of the weapon control subsystem allows the operator to enter a target range and bearing, a seeker search area size, and the aircraft speed, altitude and attitude, as will be appreciated by those skilled in the art. In addition, the control panel allows the operator to "Select" (i.e., apply three-phase and DC power to selected missile) and to "Release" (i.e., initiate internal store batteries and launch an active store from the aircraft) the desired missile. Typically, the weapon control subsystem transmits commands to the store that allow the store to receive and use the applied power when "Select" is initiated. Also, the commands cause the store to activate internal systems to a launch condition when the "Release," sometimes referred to as an Intent-to-Launch (ITL), is initiated. The store can transmit status discrete signals to the weapon control subsystem to indicate the state of the missile and to "Enable" the weapon control subsystem to open hooks on the aircraft that release the store from the pylon. In this regard, with only the power and the ITL command applied to the store and the enable status returned to the aircraft, the aircraft can launch the store.

Figure 2B:
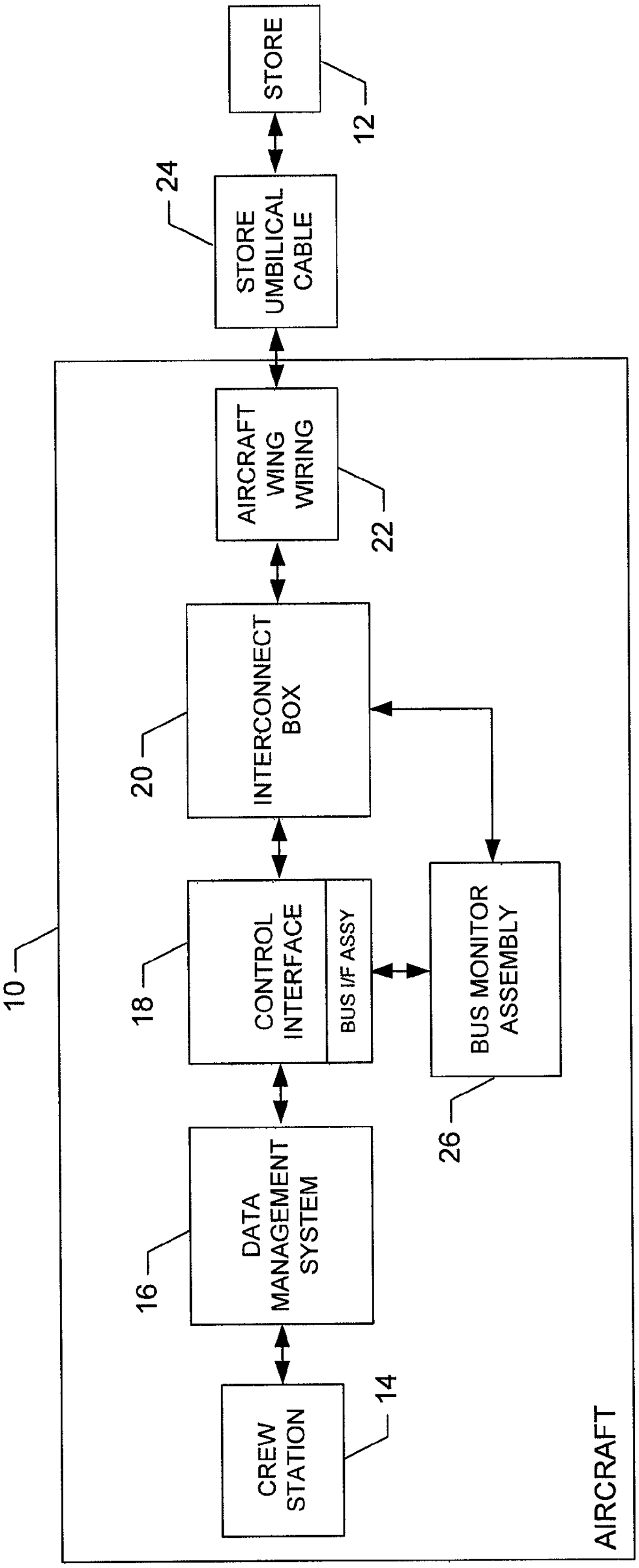
FIG. 2B is a block diagram illustrating a system for monitoring at least one data bus of an aircraft according to another embodiment of the present invention.

At this point it should be noted that some aircraft 10, such as the F-15 and USAF F-16 aircraft, while capable of launching a store 12 such as the Harpoon Block II missile, do not include the weapon control subsystem 18 required to provide power to the store and transmit and receive commands and status discrete signals, respectively, to and from the store since such aircraft were designed to launch a second predetermined type of store (e.g., Harpoon Block I missile). In such an instance, the aircraft can include a control interface 19, as shown in FIG. 2B. The control interface can comprise any of a number of different devices capable of performing the functions of the weapon control subsystem as described herein. In this regard, the control interface can be capable of launching the store provided the control interface is capable of providing power and the ITL command to the store. According to one embodiment, the control interface comprises a Harpoon Universal Launch Adapter Unit (HULAU), as such is known to those skilled in the art.

The aircraft 10 also includes an interconnect box 20 capable of mating the weapon control subsystem 18 (or control interface 19) to aircraft wing wiring 22. The aircraft wing wiring, in turn, is routed to wing pylons through an umbilical cable 24 that provides the aircraft power and control signals to the store 12, and the status signals from the store to the weapon control subsystem. The wiring also provides a communication bus 25 (see FIG. 3), such as a MK-82 Digital Data bus, that allows bi-directional communication between the weapon control subsystem and a processor (e.g., GNU) onboard the store. Typically, the aircraft wing wiring for the MK-82 Digital Data bus is used to load stores such as Harpoon Block I missiles with range, bearing altitude, speed, attitude and search parameters prior to launch of the store, as such are known to those skilled in the art. In order to facilitate the transmission and/or reception of signals via the communication bus, the weapon control subsystem and the processor (e.g., GNU) onboard the store may include a bus interface assembly 27, such as an MK-82 I/F assembly.

As is also known by those skilled in the art, Harpoon Block I missiles can be launched in any of a number of modes and, thus, the aircraft 10 can be configured in any of such modes in controlling the operation of the store 12. In this regard, Harpoon Block I missiles can be configured for operation in one of three modes, including the Range and Bearing Launch (RBL), the Bearing Only Launch (BOL), and the Line Of Sight Launch (LOS).

Figure 3:
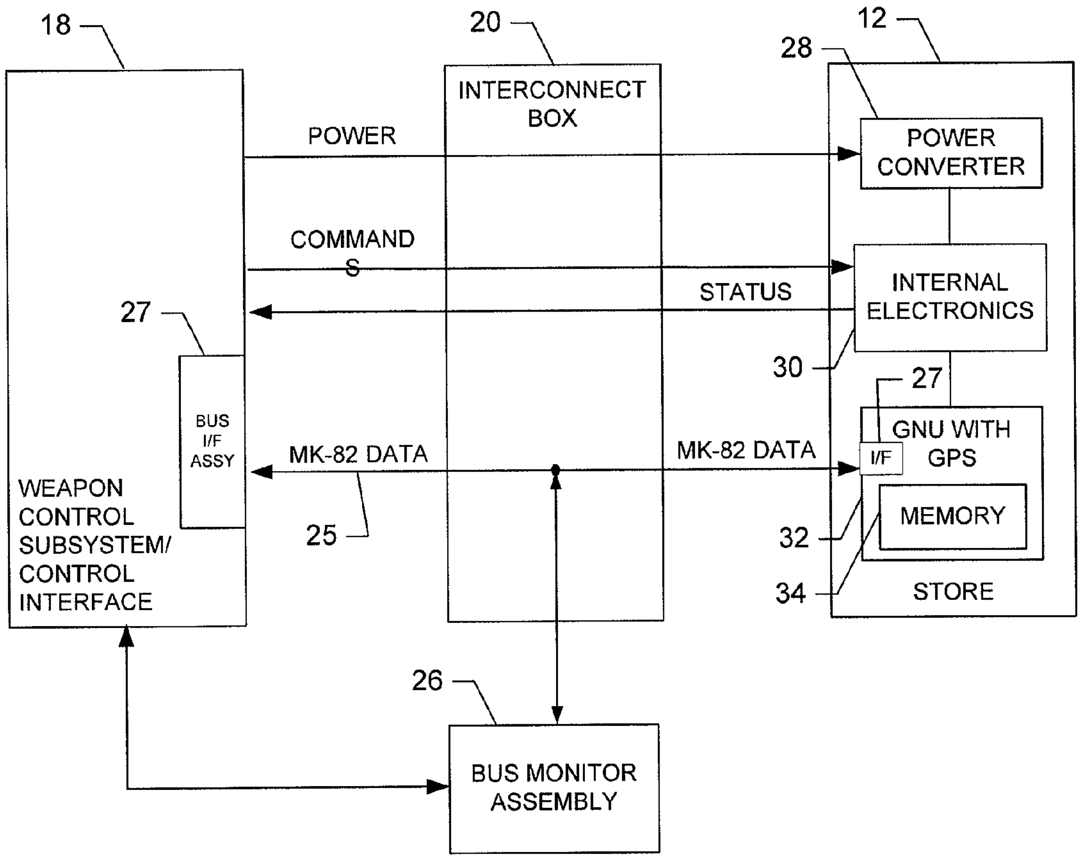
FIG. 3 is a block diagram illustrating the system of FIG. 2A highlighting the interconnection of data buses of an aircraft to a bus monitor assembly according to one embodiment of the present invention.

As is also known by those skilled in the art, and as shown in FIG. 3, stores 12 such as Harpoon Block II missiles, have the same interface, wire for wire, as the Harpoon Block I missiles described above and can function in all the same modes as Harpoon Block I missiles against targets at sea. Thus, like Harpoon Block I missiles, stores such as Harpoon Block II missiles typically include a power converter 28 for receiving three-phase power from the weapon control subsystem. Also, Harpoon Block II missiles also typically include internal electronics 30 such as sensors, control and propulsion systems that control operation of the missile and, thus, receive commands from the weapon control subsystem and provide status discretes to the weapon control subsystem. Unlike Harpoon Block I missiles, however, Harpoon Block II missiles include a global positioning system (GPS) receiver system as part of a Guidance and Navigation Unit (GNU) 32 that provides precision strike capability to attack fixed land targets with known locations. Attacking fixed land targets requires a route from the launch point to the target that avoids obstacles, such as certain threat installations, terrain obstacles and populated areas. In this regard, the GNU typically includes an internal memory 34 capable of storing a route in the form of an engagement plan including engagement plan parameters.

Route planning for a Harpoon Block II missile, sometimes referred to as engagement planning, requires the use of a computer, such as a personal computer operating engagement planning application software having Harpoon Block II performance algorithms, terrain maps of the target and vicinity and a GPS Almanac. In operation, a Harpoon Block II missile can execute five major turns, or "waypoints," from the point of launch to the target. Based upon the waypoints, then, the route and the approach angle to the target can be selected for the Harpoon Block II missiles. The computer checks each leg of the route to assure that the Harpoon Block II missile has the energy and control to execute all maneuvers and maintain the flight path and then creates an engagement plan consisting of the parameters needed by the store to execute the planned mission. Thus, with the GPS precision, there is no need for the terminal seeker and the accompanying pre-launch search size and range data required by Harpoon Block I missiles, as the missile will hit a precise latitude, longitude and altitude in the earth reference system.

Also, the GNU 32 of the Harpoon Block II missile can determine the pre-launch inertial position and velocity of the missile at the time of launch and, as such, will not require aircraft attitude, altitude or true air speed data loaded before launch. Therefore, to launch a Harpoon Block II missile from an aircraft 10 requires application of aircraft power, loading of the preplanned engagement plan and the release (i.e., initiating the store internal battery and deployment) at a predetermined launch point.

As explained in the background section, Harpoon Block II missiles (i.e., stores of a first predetermined type) generally include the same umbilical interface connection to the aircraft pylon, and use the same electrical power and control specification and connector pin assignments, as Harpoon Block I missiles (i.e., stores of a second predetermined type). In contrast to Harpoon Block I missiles, however, Harpoon Block II missiles have a more sophisticated flight control system that allows precision GPS-aided navigation to targets that cannot be assigned to Harpoon Block I missiles. The GPS-aided navigation system allows the Harpoon Block II missile to fly a more complex mission engagement path using parameters that must be preplanned and stored in the weapon's volatile memory before launch. Due to the increased number of parameters that can be loaded into Harpoon Block II missiles, conventional bus test support equipment designed for Harpoon Block I missiles cannot retain the increased amount of data, and cannot fault isolate errors in the launch equipment and missile data.

As described by the '824 application, a bus monitor assembly 26, may be capable of monitoring the communication bus 25 that allows bi-directional communication between an aircraft 10 and the store 12, or more particularly between the weapon control subsystem 18 (or control interface 19) and a processor (e.g., GNU 32) onboard the store. As explained below, the aircraft is typically adapted to control the operation of Harpoon Block I missiles (i.e., stores of a second predetermined type), whereas the store communicating with the aircraft may, instead, comprise a Harpoon Block II missile (i.e., store of a first predetermined type). More particularly, the bus monitor assembly is capable of capturing, i.e., obtaining, traffic on the communication bus (i.e., bus or data communications between the aircraft and the store), and determining if the bus communications are correct for one or more different types of stores. In addition, the bus monitor assembly can be capable of detecting events that may be reflected in one or more external outputs of the weapon control subsystem (or control interface).

Advantageously, the bus monitor assembly 26 is capable of supporting the expanded data of Harpoon Block II missiles, while also supporting the data communications to/from Harpoon Block I missiles. Also, in addition to capturing traffic on the communication bus and determining if the communications are correct, the bus monitor assembly is capable of providing menu-driven displays. Such displays, then, can facilitate a user directing the bus monitor assembly to display the captured communications, such as in word blocks by name, scaled values, and/or correctness and/or reasonableness.

Figure 4:
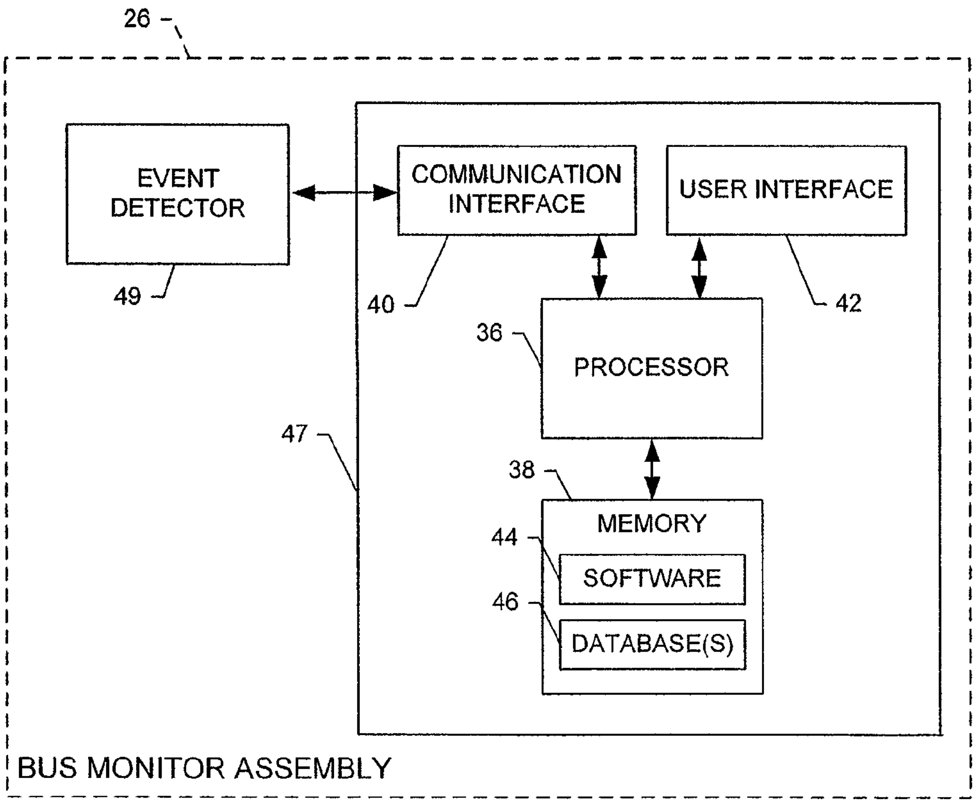
FIG. 4 is a schematic block diagram of a bus monitor assembly in accordance with embodiments of the present invention.

Referring now to FIG. 4, a block diagram of a bus monitor assembly 26, is shown. The bus monitor assembly can generally include a processor 36 connected to a memory 38. In addition, the processor can be connected to at least one communication interface 40 or other means for transmitting and/or receiving data, content or the like. In this regard, one or more of the communication interface(s) can be coupled between the communication bus 25 and the processor for connecting the communication bus and the processor. In order to permit communications with the communications bus, the communication interface can include or otherwise be embodied by a bus interface assembly, such as an MK-82 I/F assembly in embodiments in which the communication bus is an MK-82 Digital Data bus. The processor can also, but need not, be connected to a user interface 42 that can include a display and/or a user input interface. The user input interface, in turn, can comprise any of a number of devices allowing the entity to receive data from a user, such as a keypad, a touch display (not shown) or other input device.

The memory 38 can comprise volatile and/or non-volatile memory, and typically stores content, data or the like. In this regard, the memory typically stores one or more software applications 44, instructions or the like for the processor to perform steps associated with operation of the bus monitor assembly 26. For example, the memory can store a data monitoring application capable of functioning in accordance with embodiments of the present invention to capture data passing to and/or from one or more stores 12 through the interconnect box 20. The monitoring application can also be capable of driving the user interface 42 to present the captured data to a user, such as by presenting the captured data in word blocks by name, scaled values, validity and/or reasonableness. In this regard, the monitoring application can be capable of determining if the data passing to and/or from the store is valid for any one or more of a number of different types of stores, including Harpoon Block I and Block II missiles. Also, the memory can store one or more databases 46 such as to store the data passing to and/or from the store(s). The processor 36, memory, communication interface(s) 40, user interface 42, software and databases can be embodied in a computer system 47 such as a personal computer, laptop computer or the like.

In addition, the bus monitor assembly 26 can include an event detector 49 connected to one or more of the communication interface(s) 40, such as to indirectly connect the event detector to the processor 36. The event detector itself can include a processor, memory, one or more communication interfaces, and/or a user interface (not shown). Although the event detector can comprise any of a number of different devices capable of operating in accordance with embodiments of the present invention, in one embodiment the event detector comprises an oscilloscope. In this regard, the event detector can be connected to the weapon control subsystem 18 (or control interface 19) for capturing or otherwise receiving one or more external output(s) from the weapon control subsystem (or control interface). Likewise, the event detector can be connected to one or more of the communication interface(s) for receiving one or more external output(s) of the computer system 47, the external outputs being driven by the processor 36 of the computer system, and thus the bus monitor assembly. For example, one of the communication interface(s) can comprise a conventional parallel port, such as a 16-bit parallel port, including a plurality of pins. In such instances, the event detector can be connected to one or more of the pins of the parallel port. Similarly, the event detector can be connected to one or more external pins of the weapon control subsystem (or control interface).

Figure 5:
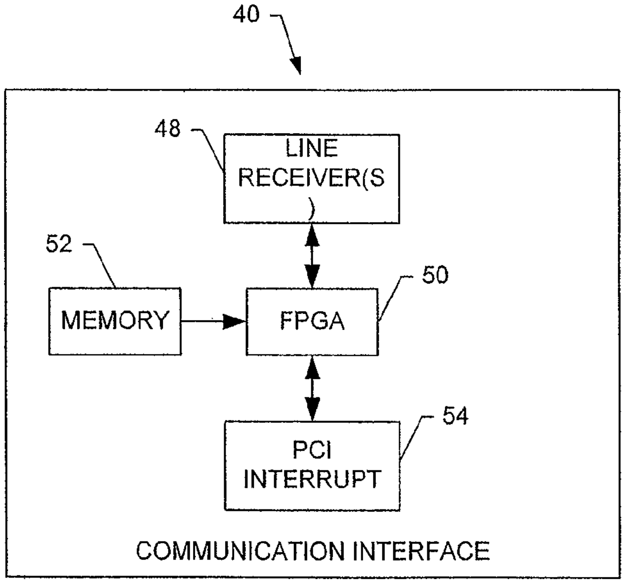
FIG. 5 is a schematic block diagram of a communication interface of a bus monitor assembly, in accordance with one embodiment of the present invention.

Referring now to FIG. 5, a block diagram of a communication interface 40 of the bus monitor assembly 26, such as a communication interface coupled between the communication bus 25 and the processor 36, is shown. As noted above, the communication interface can include or otherwise be embodied by a bus interface assembly, such as an MK-82 I/F assembly in embodiments in which the communication bus is an MK-82 Digital Data bus. As shown, the communication interface can include one or more line receivers 48 capable of capturing or otherwise receiving data communications on the communication bus 25. For example, the line receiver(s) can be capable of receiving traffic on lines J1-J6 of a MK-82 Digital Data bus, as such is well known to those skilled in the art. The communication interface can also include a processor. The processor, in turn, can comprise a Field-Programmable Gate Array (FPGA) 50, for example. In such instances, the communications interface can also include a memory 52, such as an Electrically Erasable Programmable Read-Only Memory (EEPROM). The memory, then, can store firmware code, instructions or the like for the FPGA to perform steps associated with operation of the bus monitor assembly 26.

Figure 6:
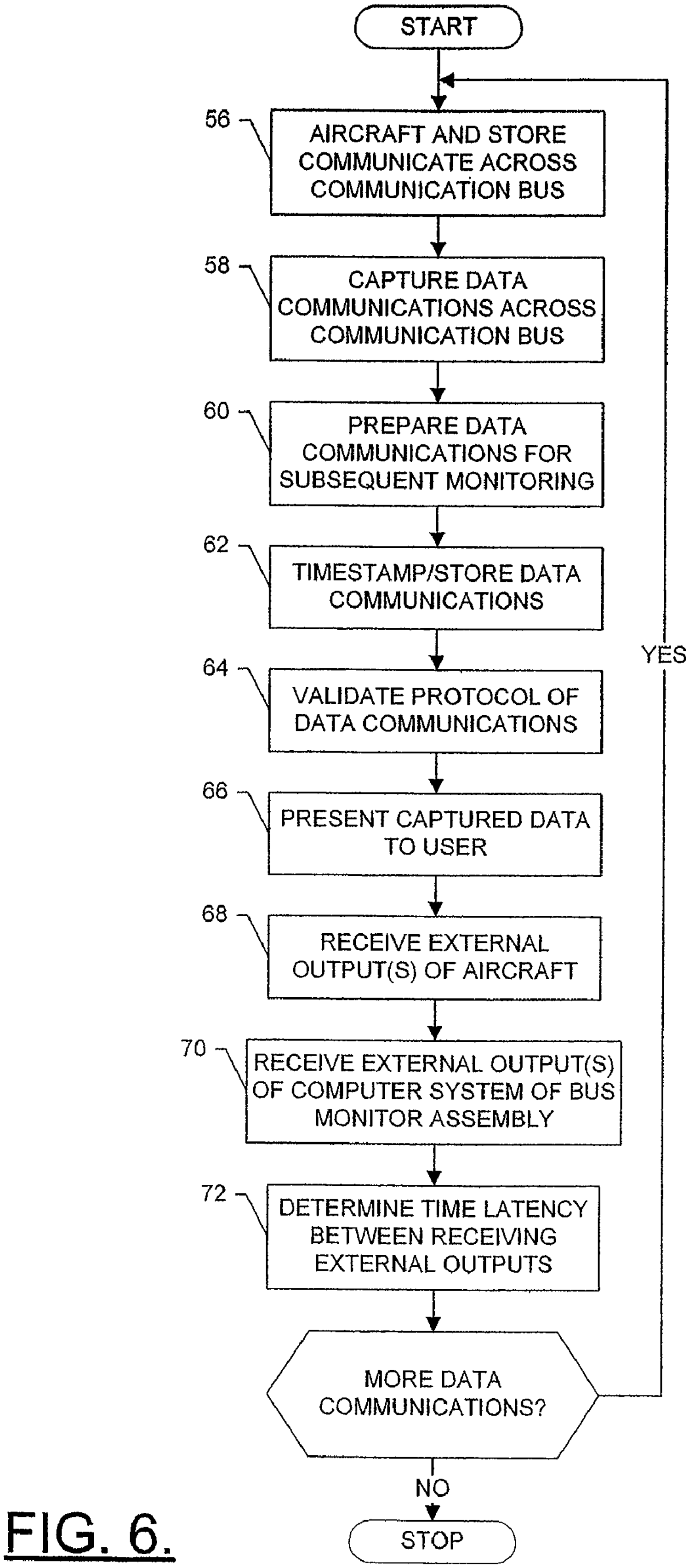
FIG. 6 is a flowchart illustrating various steps in a method of monitoring at least one data bus of an aircraft according to one embodiment of the present invention.

Reference is now made to FIG. 6, which illustrates various steps in a method of monitoring at least one data bus of an aircraft 10. As shown in block 56, the method includes the aircraft and a store 12 communicating across a communication bus 25 (e.g., MK-82 Digital Data bus) via respective bus interface assemblies. And as the aircraft and store communicate, a bus monitor assembly 26 including a bus interface assembly, e.g., MK-82 I/F assembly, captures or otherwise receives the data communications transferred between the aircraft and the store across the data communications bus, the data communications being captured by the computer system 47, as shown in block 58. The communication interface 40, or more particularly the FPGA 50 of the communication interface, then prepares the data communications for subsequent monitoring by the bus monitor assembly 26 and, if so desired, performs one or more built-in-tests (BITs) with respect to such communications, as shown in block 60. More particularly, for example, the FPGA can prepare MK-82 Digital Data Bus missile data by separating the parity bit from the remaining 16 bits of data. In this regard, the processor 36 of the bus monitor assembly can instruct the FPGA to receive and prepare data communications via an interrupt module, such as a peripheral component interconnect (PCI) interrupt module 54. Thereafter, the FPGA can provide the prepared data communications to the processor.

Upon receipt of the data communications, the bus monitor assembly 26, or more particularly the processor 36 operating the data monitoring application 44, can timestamp the captured data communications for storage in the memory 38 of the bus monitor assembly, such as in the database(s) 46 in the memory, as shown in block 62. In addition, the data monitoring application can validate the protocol of the data communications, as shown in block 64. As will be appreciated, the data monitoring application 44 can validate the message sequence of data communications between the aircraft 10 and the store 12, data word parity and/or message checksums. The data monitoring application 44 can validate the message sequence in any of a number of different manners. For example, the data monitoring application can validate the message sequence by monitoring a response to each data word transferred between the aircraft 10 and the store 12 to determine if the receiving device properly interpreted the data word. Additionally or alternatively, the data monitoring application can validate the message sequence based upon a known message sequence between the aircraft and the store during operation.

The data monitoring application 44 can likewise validate data word parity and message checksums in any of a number of different manners. For example, as is well known to those skilled in the art, the aircraft 10 and/or store 12 can be configured to perform a data transfer test whereby the aircraft and/or store check all transferred data for parity and checksum errors. In such instances, when the store/aircraft determines that data communications received from the aircraft/store are valid, the store/aircraft sets a "good data" word in the output register that gets clocked back to the aircraft/store across the communication bus 25. This "good data" word allows the aircraft/store to ascertain that the transfer was successful. Likewise, by capturing the "good data" word from the communication bus, the data monitoring application can validate the data word parity and message checksums.

Additionally or alternatively, for example, the data monitoring application 44 can validate data word parity and message checksums in a manner similar to that of the aircraft 10 and/or store 12. As known to those skilled in the art, the Harpoon MK-82 data transfer consists of 16-bit data words that each include a 17th bit added to yield odd "logic ones" parity for each set of 17 bits. Also, the total number of bits of data transferred that have the logic "one" state can be numerically added to produce a "checksum" word, which is transferred with the bus communications. These parity bits and the checksum word allow the store/aircraft, and can similarly allow the data monitoring application, to verify the accuracy of the transfer.

Thus, the data monitoring application 44 can also calculate the parity of each set of 17 bits and numerically total the logic "ones" received. The data monitoring application can then compare the calculated values to the parity and checksum values transferred across the communication bus 25. If the transferred values match the calculated values, the data monitoring application validates the parity and checksum values. Otherwise, if one or both of the transferred values do not match the calculated values, the data monitoring application invalidates the transferred value(s) that do not match the calculated value(s).

Figure 7:
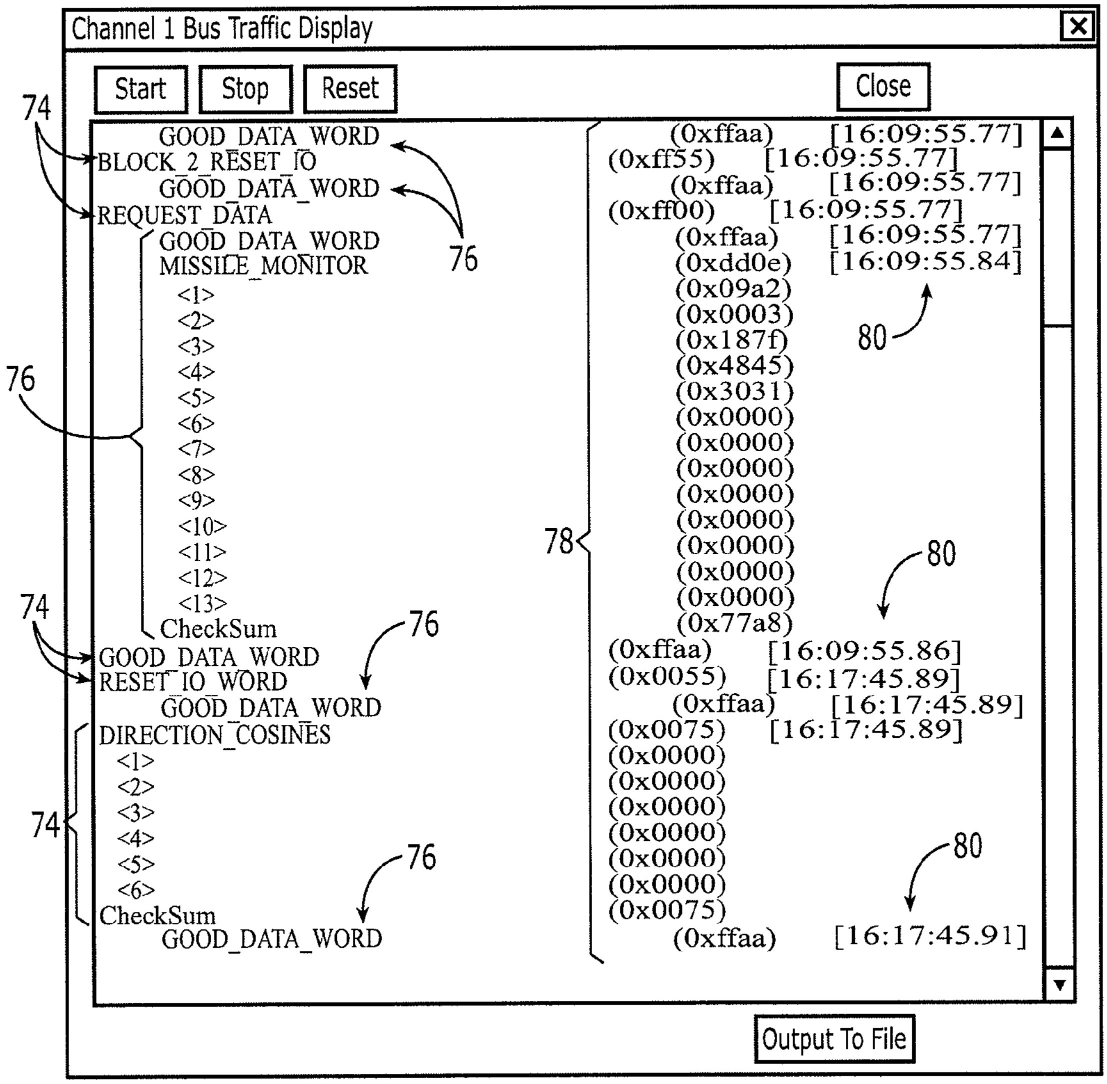
FIGS. 7 and 8 illustrate exemplary displays presented by the user interface of a bus monitor assembly, in accordance with one embodiment of the present invention.
Figure 8:
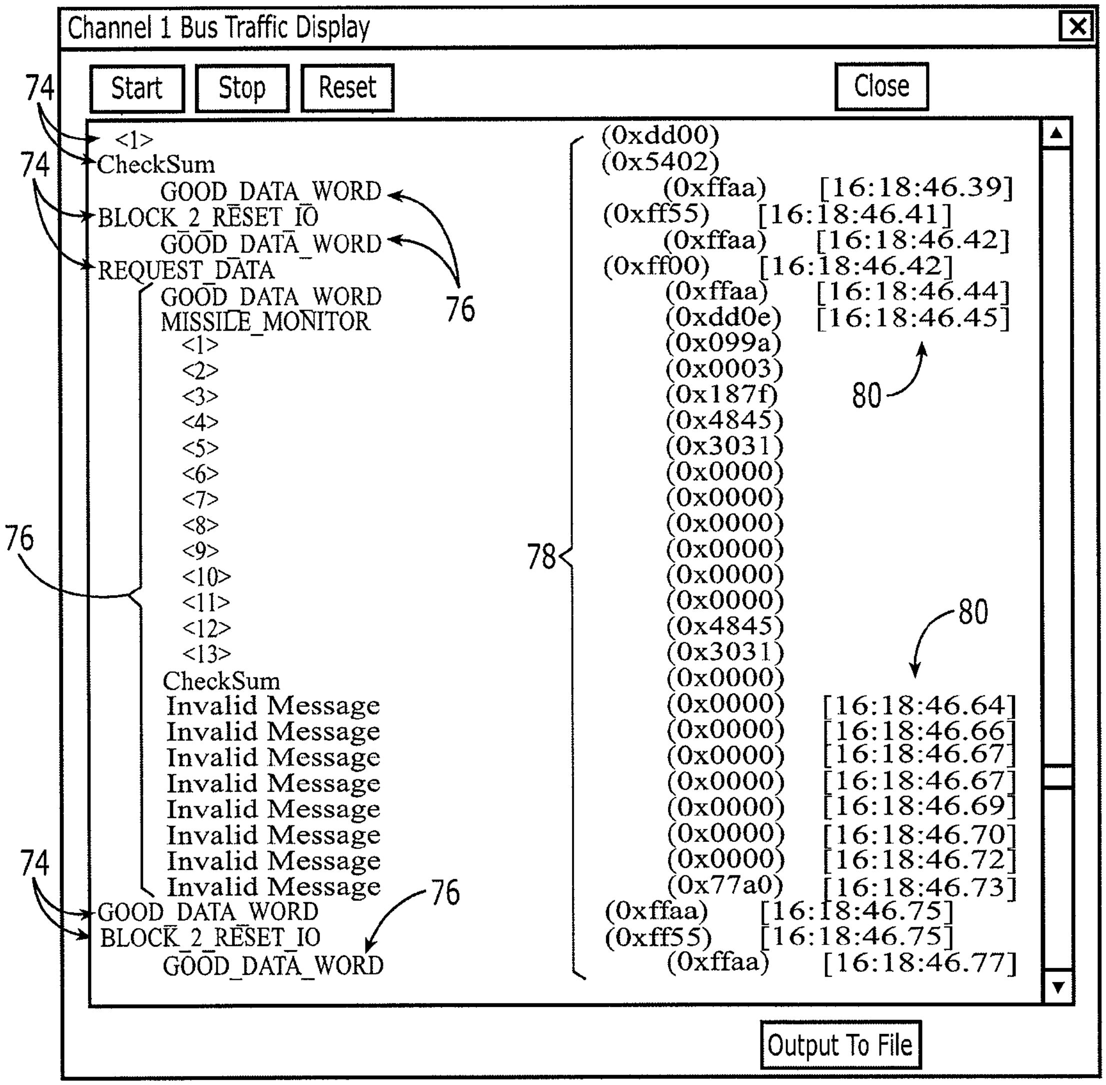

After validating the data protocol, the data monitoring application 44 can drive the user interface 42 of the bus monitor assembly 26 to present the captured data to a user, such as by presenting the captured data in word blocks by name, scaled values, validity and/or reasonableness, as shown in block 66. To more particularly illustrate exemplary displays presented by the user interface of the bus monitor assembly, reference is made to FIGS. 7 and 8. As shown, the user interface can present data communications from the aircraft 10 to the store 12 (indicated by reference 74) and data communications from the store to the aircraft (indicated by reference 76), data communications from the store to the aircraft being indented in the exemplary displays. As also shown, valid data word blocks can be identified by name (e.g., Block_2_reset 10, Good_Data_Word, etc.), and can also include a word number for those word blocks including more than one word. In contrast to valid data word blocks, the invalid data word blocks can be identified by an identifier such as "invalid message," as shown in FIG. 8. In addition, the valid and invalid data word blocks can include the transferred data word blocks 78 and/or a timestamp indicating when the bus monitor assembly captured the respective data word blocks 80.

Further, before, after or as the computer system 47 of the bus monitor assembly 26 captures data communications between the aircraft 10 and the store 12 (see block 58), the event detector 49 of the bus monitor assembly captures or otherwise receives one or more external outputs of the aircraft, or more particularly of the weapon control subsystem 18 (or control interface 19) of the aircraft, as shown in block 68. As will be appreciated, when the weapon control subsystem (or control interface) of the aircraft processes various data communications for transfer to the store, such as time critical data communications (e.g., attitude data communications), the weapon control subsystem (or control interface) can be configured to provide an external output of such data processing. And when the time critical data communications are transferred across the communication bus 25, the computer system 47 of the bus monitor assembly can be configured to likewise provide an external output of such data passing to the store, which the event detector can also capture or otherwise receive, as shown in block 70.

Based upon the external output(s) captured from the weapon control subsystem 18 (or control interface 19) and the computer system 47 of the bus monitor assembly 26, then, the event detector can determine, or facilitate a user determining, a time latency between receiving the external outputs from the aircraft 10 and the computer system 47 of the bus monitor assembly 26, as shown in block 72. More particularly, the event detector can determine, or facilitate a user determining, a time latency between processing of a time critical data communication and transfer of the respective time critical data communication across the communication bus. This time latency can then be presented or otherwise illustrated (e.g., by comparison of receipt of the external output(s) from the aircraft and the computer system) by the user interface of the event detector. Additionally or alternatively, data representative of receipt of the external output(s) (e.g., timestamps) and/or the determined time latency can be captured or otherwise stored by another device, such as the computer system of the bus monitor assembly, for subsequent presentation, analysis or the like.

As will be appreciated, the method of monitoring the communication bus 25 of the aircraft 10 can continue while the aircraft and store 12 communicate across the communication bus (see block 56), as shown in block 74. In this regard, for data communications transferred across the communication bus, the bus monitor assembly 26, or more particularly the computer system 47 of the bus monitor assembly, can repeatedly capture the data communications (see block 58), and prepare the data communications for subsequent monitoring (see block 60). Also, the computer system can repeatedly timestamp and store the data communications (see block 62), validate the protocol of the data communications (see block 64), and present the captured data to the user (see block 66). In addition, the event detector 49 of the bus monitor assembly can repeatedly receive external output(s) of the aircraft and the computer system (see blocks 68 and 70), and determine a time latency based upon the external outputs (see block 72).

Figure 9:
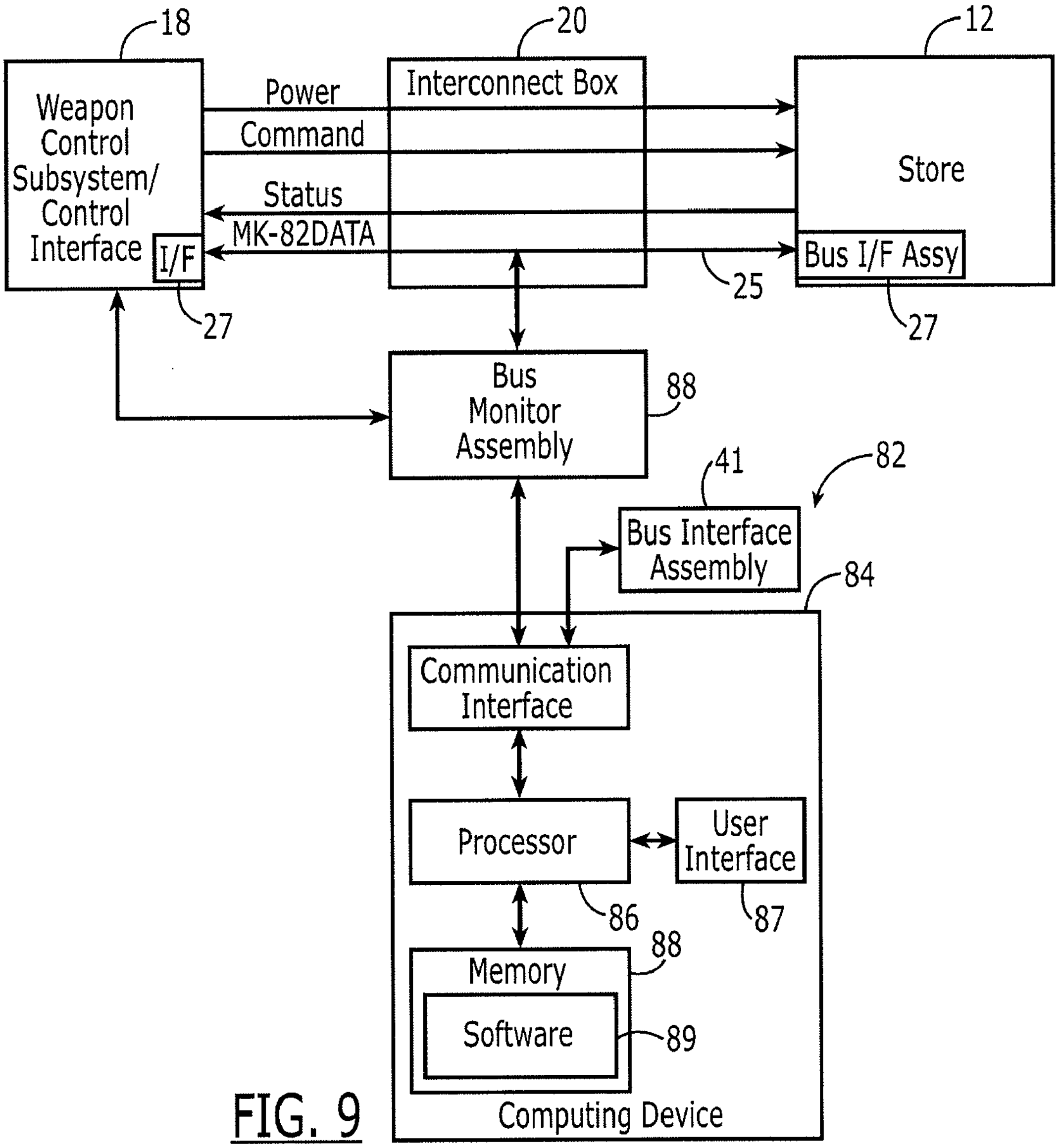
FIG. 9 is a schematic block diagram of a system including several bus interface assemblies, such as MK 82 I/F assemblies, and a bus interface test assembly in accordance with embodiments of the present invention.

In accordance with embodiments of the present invention, it is desirable to test and, if necessary, to troubleshoot a bus interface assembly, e.g., an MK 82 I/F assembly, such as the bus interface assemblies of the weapon control subsystem 18, the store 12, e.g., GNU 32, and/or the bus monitor assembly 26. As such, a bus interface test assembly 82 may be provided as shown in FIG. 9 in accordance with one embodiment of the present invention. In this regard, the bus interface test assembly is generally embodied as a computing device 84 that includes a processor 86, a memory 88 for storing software 89 and a communications interface 40 as shown in more detail in FIG. 5 for connecting the communication bus 25 and the processor in order to transmit and/or receive data, content or the like. The bus interface test assembly may be embodied by a wide variety of computing devices including workstations, personal computers, laptop computers, and the like. In one embodiment depicted in FIG. 9, however, the bus interface test assembly is embodied by the same computing device that embodies the bus monitor assembly and, as such, the processor, the memory and the communications interface of the bus interface test assembly may be embodied by the same processor, memory and communications interface as that disclosed above in conjunction with the bus monitor assembly. As shown in FIG. 9, however, the bus interface assembly 41 of the bus monitor assembly, which may be embodied within the communications interface in one embodiment, may be external to the computing device in other embodiments in order to facilitate programming, testing and/or troubleshooting of the bus interface assembly as described below. In any event, the memory can comprise volatile and/or non-volatile memory, and typically stores one or more software applications, computer program instructions or the like for causing the processor to perform steps associated with the operation of the bus interface test assembly. For example, the memory can store a software application designed to test the bus interface assembly as well as a troubleshooting application designed to perform a troubleshooting routine upon the bus interface assembly in instances in which the testing of the bus interface assembly has indicated that the bus interface assembly may have malfunctioned. Still further, the memory can store content, data or the like that is loaded into the memory of the bus interface assembly in order to program the bus interface assembly or to reconfigure the bus interface assembly, such as in response to a determination that the bus interface assembly has malfunctioned as described in accordance with one embodiment hereinafter.

In operation, the bus interface test assembly 82 is configured to determine if a bus interface assembly, e.g., an MK 82 I/F assembly, such as the bus interface assembly 41 of the bus monitor assembly 26 and/or the bus interface assemblies 27 of the weapon control subsystem 18 and the store 12, e.g., GNU 32, is configured to correctly monitor data communications across the data bus 25 between the aircraft 10 and the store 12. The testing of the bus interface assembly that is performed by the bus interface test assembly may occur at any stage and may be performed by anyone in the chain of custody of the aircraft. For example, the testing provided by the bus interface test assembly may be performed by the manufacturer, system integrator or customer of the aircraft, or may be performed by the manufacturer of the bus interface assembly prior to installation.

Figure 10:
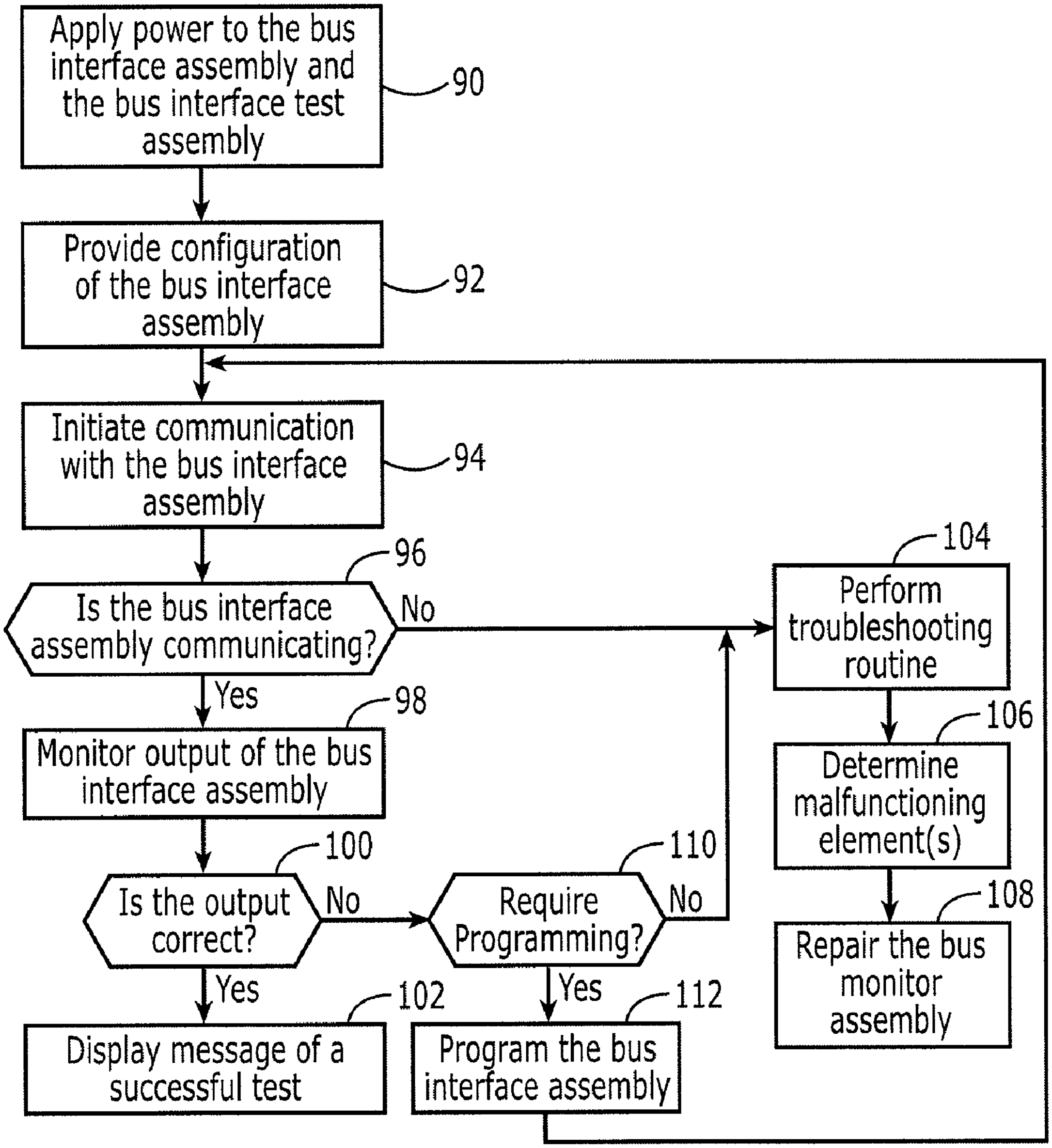
FIG. 10 is a flowchart illustrating various steps for testing and troubleshooting a bus interface assembly, such as an MK 82 I/F assembly, according to embodiments of the present invention.

In order to test a bus interface assembly, e.g., an MK 82 I/F assembly, as shown in FIG. 10, once both the bus interface assembly and the bus interface test assembly 82 have been powered up, the bus interface test assembly initiates communication with the bus interface assembly (see blocks 90 and 94). In embodiments in which the bus interface test assembly is configured to differently test two or more different configurations of bus interface assemblies, the configuration of a bus interface assembly under test is provided to the bus interface test assembly, such as by an operator via a user interface 87, such as a keyboard or a touch screen, of the bus interface test assembly (see block 92). In order to initiate communications with the bus interface assembly, the bus interface test assembly generally sends data and/or a request to the bus interface assembly which elicits a response from the bus interface assembly. For example, the bus interface test assembly may provide a block of data to the bus interface assembly and may request that the bus interface assembly reply with its status.

The bus interface test assembly 82 then determines if the bus interface assembly replied (see block 96). If the bus interface assembly appropriately responds to the initiation of communication by the bus interface test assembly, the bus interface test assembly will issue a series of instructions to the bus interface assembly designed to test one or more of the functions of the bus interface assembly. More typically, the bus interface test assembly is configured to provide instructions to the bus interface assembly which tests each of the functions of the bus interface assembly. The various functions of the bus interface assembly will depend upon the type of bus interface assembly that is undergoing the test. For example, in the embodiment described above in which the bus interface assembly 41 is embodied by the bus monitor assembly 26, the functions of the bus monitor assembly generally include the capture of data communications across the data bus, the time stamping and storage of the data communications, the validation of the protocol of the data communications, the performance of one or more built-in-tests (BITs) with respect to the data communications, the preparation of the data communications for subsequent monitoring, the presentation of the captured data communications, the receipt of external outputs of the aircraft and the computer system of the bus monitor assembly, and the determination of the time latency between the receipt of the external outputs.

Accordingly, in this exemplary embodiment, the bus interface test assembly 82 may provide a block of data to the bus monitor assembly 26 that represents data communications that the bus monitor assembly would otherwise have captured from the data bus 25. The bus interface test assembly can then instruct the bus monitor assembly to process the data, such as in a manner described above in conjunction with FIG. 6 and to provide its output to the bus interface test assembly (see block 98). Since the data that is provided to the bus monitor assembly by the bus interface test assembly is predefined, the results that are anticipated to be generated by the bus monitor assembly in response to its processing of the data, such as in accordance with the method depicted in FIG. 6, can also be predefined. As such, the bus interface test assembly can compare the results provided by the bus monitor assembly in response to its analysis of the data provided by the bus monitor assembly with the predefined results stored by the bus interface test assembly in order to determine if the bus interface assembly 41 of the bus monitor assembly is performing properly or is malfunctioning (see block 100). By providing data representative of different types of communication that would otherwise be transmitted via the data bus, the bus interface test assembly of this embodiment can evaluate the performance of the bus interface assembly as it performs each of its predefined functions. In this regard, the bus interface test assembly can alternately provide data that is representative of instances in which an aircraft 10 is intending to communicate with a store 12 of the first predetermined type and a store of a second predetermined type.

In instances in which the bus interface test assembly 82 determines that the bus interface assembly 41 of the bus monitor assembly 26 is performing properly, the operator may be notified that the bus interface assembly is performing properly and the bus interface assembly can be introduced or returned to service (see block 102). Alternatively, in instances in which the bus interface test assembly determines that the bus interface assembly is not performing properly, the bus interface test assembly may next determine if the bus interface assembly requires programming as shown in block 110. In one embodiment, the bus interface test assembly determines if the bus interface assembly requires programming by obtaining configuration information from the bus interface assembly and then comparing the configuration information provided by the bus interface assembly to that previously provided as shown, for example in block 92. In instances in which the configuration information obtained from the bus interface assembly does not match the configuration information that was previously provided, the bus interface test assembly can reprogram the bus interface assembly as described below and as shown in block 112, prior to again testing the bus interface assembly. Alternatively, in instances in which the configuration information obtained from the bus interface assembly does match the configuration information that was previously provided, the bus interface test assembly may then perform a troubleshooting routine to more specifically identify the malfunction of the bus interface assembly, such as by identifying one or more individual elements or components of the bus interface assembly that appear to be candidates to have malfunctioned (see blocks 104 and 106). In this regard, the bus interface test assembly may provide an additional series of instructions to the bus interface assembly and then monitor the outputs provided by the bus interface assembly in order to determine which portions or elements of the bus interface assembly appear to be malfunctioning. The particular troubleshooting routine that is performed will depend upon the type and configuration of the bus interface assembly as will be known to those skilled in the art. Once the bus interface test assembly has identified one or more elements of the bus interface assembly that appear to be candidates to have malfunctioned, the bus interface test assembly may notify the operator who may then take steps to remove the bus interface assembly from service (if the bus interface assembly was already in service) and then arrange to have the bus interface assembly repaired, such as by removing and replacing the elements identified to have potentially malfunctioned (see block 108). Alternatively, if the bus interface test assembly is unable to identify any specific elements of the bus interface assembly to have malfunctioned, the bus interface test assembly may so notify the operator who again will generally remove the bus interface assembly from service (if the bus interface assembly was already in service) and either perform additional testing of the bus interface assembly in an effort to identify specific elements of the bus interface assembly that have malfunctioned or simply replace the entire bus interface assembly.

By testing and, if necessary, troubleshooting the bus interface assembly, the bus interface test assembly 82 of embodiments of the present invention is able to identify instances in which the bus interface assembly has malfunctioned and facilitate the repair of the bus interface assembly in a timely fashion. As such, the bus interface test assembly facilitates the reliable operation of the bus interface assembly and, in one embodiment, the reliability of the communications between the aircraft 10 and stores 12 of the first and second predetermined types.

The bus interface test assembly 82 is also configured to program the bus interface assembly, e.g., an MK 82 I/F assembly in some embodiments. For example, the bus interface test assembly may be configured to initially program the bus interface assembly, such as prior to placement of the bus interface assembly in service. Alternatively, the bus interface test assembly may be configured to program the bus interface assembly in order to reconfigure the bus interface assembly, such as to provide additional or different functionality, e.g., in instances in which the aircraft is now anticipated to carry and deploy stores of a different type than those previously carried and deployed by the aircraft. In addition, in instances in which the bus interface test assembly determines that the bus interface assembly is not performing properly, such as a result of the testing provided by the bus interface test assembly that is described above and shown in FIG. 10, the bus interface test assembly may simply reprogram the bus interface assembly in an effort to cure any malfunction associated with the bus interface assembly. Following the programming, the bus interface assembly can again be tested by the bus interface test assembly and if the bus interface assembly now performs properly, the bus interface assembly can be released into service. In contrast, in instances in which the bus interface assembly continues to malfunction even after having been reprogrammed, the bus interface test assembly may then perform the troubleshooting routine described above in an effort to identify one or more elements of the bus interface assembly that are candidates to have malfunctions.

In order to program the bus interface assembly, e.g., an MK 82 I/F assembly, the bus interface test assembly 82 generally includes programming firmware, such as a block of programming instructions stored in memory 88. The bus interface test assembly may therefore download the programming instructions to the bus interface assembly which, in turn, is instructed to store the programming instructions in memory 38, thereby overwriting some or all of the programming instructions previously stored by the bus interface assembly, if any. As such, the bus interface test assembly of this embodiment of the present invention also provides a mechanism for readily programming the bus interface assembly, either initially, in response to a desired reconfiguration of the bus interface assembly or in an effort to cure a malfunctioning bus interface assembly.

As described above, the bus interface test assembly 82 is configured to program, test and/or troubleshoot the bus interface assembly 41 of a bus monitor assembly 26. However, the bus interface test assembly can also program, test and/or troubleshoot any other type of bus interface assembly, such as the MK-82 I/F cards 27 of the weapon control subsystem 18 and the store 12, e.g., GNU 32. Additionally, as new bus interface cards are manufactured, the bus interface test assembly can program the bus interface cards and can then test and/or troubleshoot the new bus interface cards prior to releasing the new bus interface cards into service. Similarly, the bus interface test assembly may be employed to program, test and/or troubleshoot bus interface cards following installation, either as part of the field service operations or the depot operations. In conjunction with the field operations, a bus interface test assembly can test a bus interface card following its installation, i.e., once the bus interface card is in service. If the bus interface test assembly determines that the bus interface card is faulty, the bus interface test assembly can troubleshoot the bus interface card in the field to determine, for example, if the bus interface card has a configuration issue, software corruption or a hardware failure. Based on the output of the troubleshooting routine, a decision can be made as to whether to replace the entire bus interface card, to re-configure the bus interface card or to re-program the software of the bus interface card. Alternatively, in a depot that has received a damaged or defective bus interface card, the bus interface test assembly can test the bus interface card and the troubleshooting routine can determine the cause of the failure. Thereafter, a decision can be made as to whether to re-configure the bus interface card, to re-program the bus interface card or to destroy the bus interface card.

Additionally, while the bus interface card has been described above to be onboard an aircraft 10, the bus interface card may be included in a variety of devices including missile simulators and command and launch systems (CLS). Additionally, the platform of the CLS need not necessarily be an aircraft, but can alternatively be ship or ground-based. Still further, the bus interface card need not yet be embedded in a device at the time that the bus interface test assembly 82 tests the bus interface card, such as in instances in which the bus interface card is tested during or following manufacture.

According to one aspect of the present invention, all or a portion of the system of the present invention, such as all or portions of the bus interface assembly, e.g., an MK 82 I/F assembly and the bus interface test assembly 82, generally operates under control of a computer program product. The computer program product for performing the methods of embodiments of the present invention includes a computer-readable storage medium, such as the non-volatile storage medium, and computer-readable program code portions, such as a series of computer instructions, embodied in the computer-readable storage medium.

In this regard, FIGS. 6 and 10 are flowcharts of methods, systems and program products according to embodiments of the present invention. It will be understood that each block or step of the flowchart, and combinations of blocks in the flowchart, can be implemented by computer program instructions. These computer program instructions may be loaded onto a computer or other programmable apparatus to produce a machine, such that the instructions which execute on the computer or other programmable apparatus create means for implementing the functions specified in the flowchart block(s) or step(s). These computer program instructions may also be stored in a computer-readable memory that can direct a computer or other programmable apparatus to function in a particular manner, such that the instructions stored in the computer-readable memory produce an article of manufacture including instruction means which implement the function specified in the flowchart block(s) or step(s). The computer program instructions may also be loaded onto a computer or other programmable apparatus to cause a series of operational steps to be performed on the computer or other programmable apparatus to produce a computer implemented process such that the instructions which execute on the computer or other programmable apparatus provide steps for implementing the functions specified in the flowchart block(s) or step(s).

Accordingly, blocks or steps of the flowchart support combinations of means for performing the specified functions, combinations of steps for performing the specified functions and program instruction means for performing the specified functions. It will also be understood that each block or step of the flowchart, and combinations of block(s) or step(s) in the flowchart, can be implemented by special purpose hardware-based computer systems which perform the specified functions or steps, or combinations of special purpose hardware and computer instructions.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A system configured to interface with a data bus of an aircraft via which operation of a store is controlled, the system comprising:

a bus monitor assembly configured to capture data communications transferred across the data bus between the aircraft and the store, wherein the bus monitor assembly is also configured to prepare the data communications and monitor the data bus across which the data communications are transferred, the data bus being monitored based upon the prepared data communications;

a bus interface assembly configured to interface with the data bus between the aircraft and the store; and a bus interface test assembly configured to determine if the bus interface assembly is configured to correctly interface with the data bus, the bus interface test assembly being further configured to perform a troubleshooting routine if the bus interface assembly is not configured to correctly interface with the data bus in order to identify a malfunction of the bus interface assembly.

2. A system according to claim 1 wherein the bus interface test assembly is further configured to program the bus interface assembly.

3. A system according to claim 1 wherein the bus interface test assembly is configured to perform a troubleshooting routine to identify one or more elements of the bus interface assembly that are candidates to have malfunctioned.

4. A system according to claim 1 wherein the bus interface test assembly is further configured to initiate communications with the bus interface assembly.

5. A system according to claim 4 wherein the bus interface test assembly is further configured to cause the bus interface assembly to perform each of a plurality of predefined functions in order to determine if the bus interface assembly is configured to correctly interface with the data bus.

6. A system according to claim 1 further comprises a wherein the bus monitor assembly comprises:

a computer system configured to provide at least one external output in response to capture of the data communications; and an event detector configured to capture at least one external output of the aircraft, and configured to capture the at least one external output of the computer system, wherein the event detector is configured to one of determine, or facilitate determination of, a time latency between capture of the at least one external output of the aircraft and the at least one external output of the computer system.

7. A system according to claim 1 wherein the bus monitor assembly comprises the bus interface assembly.

8. A system according to claim 3 wherein the bus interface test assembly is further configured to reconfigure the bus interface assembly in response to an indication that the bus interface assembly has malfunctioned.

9. A system configured to interface with a data bus of an aircraft via which operation of a store is controlled, the system comprising:

a computing device comprising a processor and in communication with the data bus; and a bus monitor assembly which is configured to capture data communications transferred across the data bus between the aircraft and the store, wherein the bus monitor assembly is also configured to prepare the data communications and monitor the data bus across which the data communications are transferred, the data bus being monitored based upon the prepared data communications;

a bus interface assembly in communication with the computing device and configured to interface with the data bus between the aircraft and the store, wherein the processor is configured to determine if the bus interface assembly is configured to correctly monitor the data communications and, if not, to perform a troubleshooting routine in order to identify a malfunction of the bus interface assembly.

10. A system according to claim 9 wherein the processor is further configured to program the bus interface assembly.

11. A system according to claim 9 wherein the processor is configured to perform a troubleshooting routine to identify one or more elements of the bus interface assembly that are candidates to have malfunctioned.

12. A system according to claim 9 wherein the processor is further configured to initiate communications with the bus interface assembly.

13. A system according to claim 12 wherein the processor is further configured to cause the bus interface assembly to perform each of a plurality of predefined functions in order to determine if the bus interface assembly is configured to correctly interface with the data bus.

14. A system according to claim 9 wherein the bus monitor assembly further comprises:

a computer system configured to provide at least one external output in response to capture of the data communications; and an event detector configured to capture at least one external output of the aircraft, and configured to capture the at least one external output of the computer system, wherein the event detector is configured to one of determine, or facilitate determination of a time latency between capture of the at least one external output of the aircraft and the at least one external output of the computer system.

15. A system according to claim 9 wherein the bus monitor assembly comprises the bus interface assembly.

16. A system according to claim 11 wherein the bus interface test assembly is further configured to reconfigure the bus interface assembly in response to an indication that the bus interface assembly has malfunctioned.

17. A method of interfacing with a data bus of an aircraft via which operation of a store is controlled, the method comprising:

providing a bus interface assembly for interfacing with the data bus between the aircraft and the store;

capturing data communications transferred across the data bus between the aircraft and the store;

preparing the data communications;

monitoring the data bus across which the data communications are transferred, the data bus being monitored based upon the prepared data communications;

determining if the bus interface assembly is configured to correctly interface with the data bus; and performing a troubleshooting routine if the bus interface assembly is not configured to correctly interface with the data bus in order to identify a malfunction of the bus interface assembly.

18. A method according to claim 17 further comprising programming the bus interface assembly prior to determining if the bus interface assembly is configured to correctly interface with the data bus.

19. A method according to claim 17 wherein performing the troubleshooting routine comprises identifying one or more elements of the bus interface assembly that are candidates to have malfunctioned.

20. A method according to claim 17 further comprising initiating communications with the bus interface assembly prior to determining if the bus interface assembly is configured to correctly interface with the data bus.

21. A method according to claim 20 wherein determining if the bus interface assembly is configured to correctly interface with the data bus comprises further comprises causing the bus interface assembly to perform each of a plurality of predefined functions.

22. A method according to claim 17, wherein capturing data communications comprises capturing data communications at the bus interface assembly, and wherein the method comprises:

capturing at least one external output of the aircraft;

capturing at least one external output of the bus interface assembly, the at least one external output being provided in response to the bus interface assembly capturing data communications; and determining a time latency between capturing the at least one external output of the aircraft and the at least one external output of the bus interface assembly.

* * * * *